(12) United States Patent
Wu et al.

(10) Patent No.: US 6,472,023 B1
(45) Date of Patent: Oct. 29, 2002

(54) SEED LAYER OF COPPER INTERCONNECTION VIA DISPLACEMENT

(75) Inventors: Yang Wu, Hsinchu (TW); Chi-Chao Wan, Hsinchu (TW)

(73) Assignee: Chang Chun Petrochemical Co., Ltd., Taipei (TW)

( * ) Notice: Subject to any disclaimer, the term of this patent is extended or adjusted under 35 U.S.C. 154(b) by 0 days.

(21) Appl. No.: 09/900,851

(22) Filed: Jul. 10, 2001

(51) Int. Cl.[7] .............................. B05D 1/18; B05D 3/04; C23C 28/02
(52) U.S. Cl. .................... 427/430.1; 427/301; 427/304; 427/98; 427/97; 205/184; 205/125
(58) Field of Search ............................... 427/430.1, 301, 427/304, 98, 97; 438/686, 758; 106/1.11; 205/123, 157, 210, 184, 125

(56) References Cited

FOREIGN PATENT DOCUMENTS

DE          31 44374 A1 *  5/1983

OTHER PUBLICATIONS

Anonymous, "Reclamation of Palladium From Colloidal Seeder Solutions—Using Trucking of Colloid with Oxygen to Eliminate Trucking of Hazardous Waste", Reseach Document RD 314048A, p. 493. Jun. 1990.*

* cited by examiner

Primary Examiner—Edna Wong
(74) Attorney, Agent, or Firm—Bacon & Thomas

(57) ABSTRACT

A process for the fabrication of submicron copper interconnection useful on IC structures without deposition of copper seed is described. A dense metal layer can be deposited through contact displacement reaction between diffusion barrier layer and metal ions in solution under appropriate conditions. The metal layer formed by the displacement deposition can serve as the conducting material for subsequent copper electroplating. Moreover, the costly process for applying seed layer through CVD or PVD can be eliminated.

10 Claims, 5 Drawing Sheets

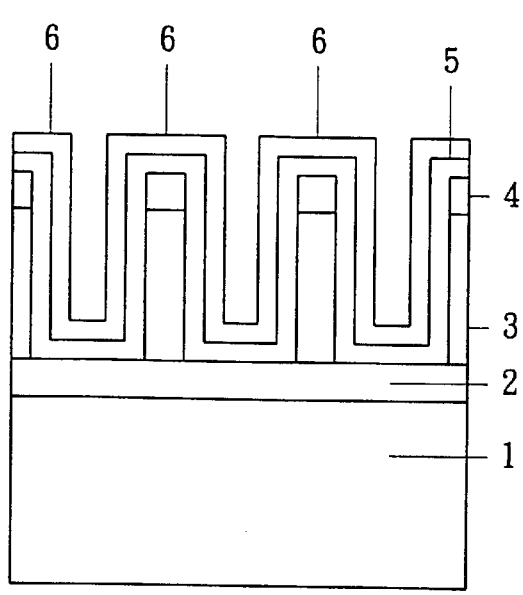
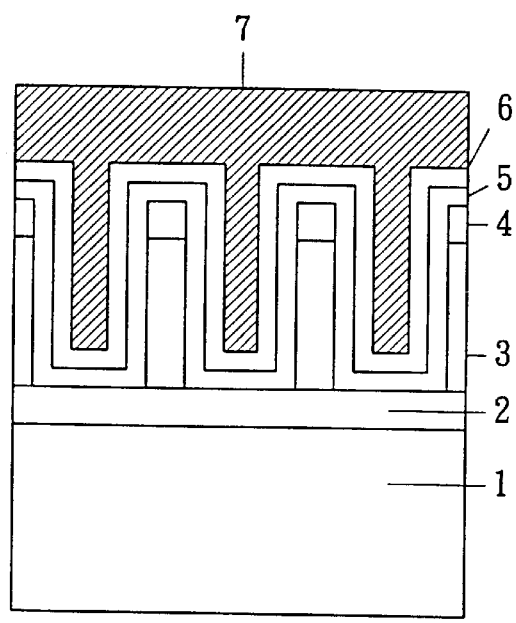
Fig. 5      Fig. 6
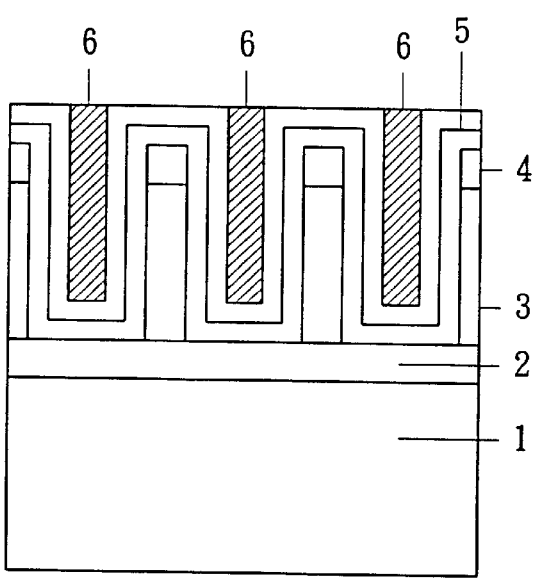
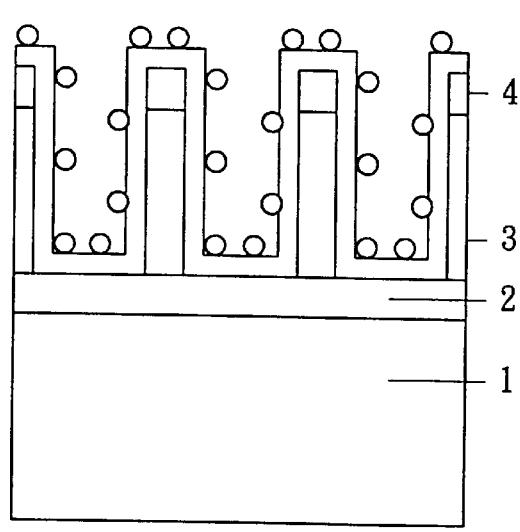
Fig. 7      Fig. 8

SEED LAYER OF COPPER INTERCONNECTION VIA DISPLACEMENT

BACKGROUND OF THE INVENTION

1. Field of the Invention

The invention relates to a process for the fabrication of submicron copper interconnection on integrated circuit structure by depositing directly a metal layer on the resist layer via displacement deposition to replace the original copper seed layer, followed by copper electroplating to form a submicron copper interconnection.

2. Description of the Related Prior Art

In order to coordinate the increasingly smaller but higher efficient integrated circuit (IC), the fabrication of the interconnection must meet the requirement of deep submicron level. However, due to properties such as resistance, electromigration impedance and the like, aluminum used in traditional process becomes no more advantageous. On the contrary, copper exhibits several advantages such as low resistance, higher melting point, as well as better electromigration impedance. Further, problems associated with the prior art, such as the unavailability of reactive ion etching process and the diffusion into oxide layer, have now been overcome through the research and development of Dual Damascene process. Therefore, copper is now considered as the best material for the next generation IC interconnection.

So far, copper deposition process is a relatively important process for IC or printed circuit board industries, especially for the fine circuit with high aspect ratio. Techniques employing copper as the interconnection in the integrated circuit generally deposit copper through one of following processes: sputtering, physical vapor deposition, chemical vapor deposition, electrochemical deposition and the like.

As to the physical vapor deposition, problems with respect to the overhangs of contact opening have been now in a very difficult state. As to the chemical vapor deposition, a difficulty to be solved is that non-volatile $CuCl_2$ solid would be generated during the process. Therefore, substituting aluminum circuit with high conductive copper circuit must be conducted with other manners, such as copper deposition by electroplating, for example, that disclosed in U.S. Pat. No. 5,256,274. The depositing solution disclosed in that patent contained 12 ounce of copper sulfate pentahydrate per gallon water, 10% sulfuric acid, 50 ppm chloride ion and 0.4% additives. After researching and developing over 10 years, IBM Company claimed in the end of 1997 that a copper circuit of sub-0.25 micro on IC chip had been accomplished successfully by a electrochemical deposition method. Heretofore, the advantage of copper deposition has been recognized by the semiconductor industry.

Before deposition of copper layer by electroplating manner, a layer of diffusion barrier layer and a thin membrane of seed copper layer must be deposited on the silicon wafer by sputtering or chemical vapor deposition process. The diffusion barrier layer is, at the present time, composed predominantly of titanium nitride (TiN) or tantalum nitride (TaN) and is on a primary object of preventing the diffusion between the copper layer and the dielectric silicon dioxide ($SiO_2$). The copper seed layer is used for conducting electric current during electroplating.

For the academic research on displacement reaction, Yosi Shacham-Diamand et al. proposed in The Electrochemical Society 144 P. 898–908, 1997, a formula for wet activating titanium nitride surface by a solution and yielding a Cu layer as the seed layer for electroplating or electroless plating, thereby preparation of the seed layer by the expensive PVD or CVD process can be eliminated. On the other hand, for the industrial research, IBM Company proposed a process for activating the surface titanium nitride with a solution containing hydrofluoric acid or copper sulfate and subsequently displacement depositing a copper seed layer. This process was described in detailed in their ROC Patent Application No. 86119270.

Deposition of a metal layer on the surface of the barrier layer material by displacement deposition had been taught in several U.S. patents. For example, Baum et al. disclosed in U.S. Pat. No. 4,574,095, a process for depositing palladium on a silicon substrate by catalyzing reaction under light irradiation, and subsequently depositing copper by electroless plating thereto.

Wong disclosed in U.S. Pat. No. 5,358,907 that, using displacement plating, metal from IB, IIB, IIIA, IVB, VB, VIB, VIIB or VIIIB groups can be deposited on silicon substrate or silicon-containing compound, wherein the formulation of the displacement solution contained hydrofluoric acid (HF).

Valery M. Dubin et al. disclosed in U.S. No. 5,891,513 the use of the displacement process on the integrated circuit, wherein, a solution consisting of 0.001–2 mol/l of copper ion, 0.001–5 mol/l of fluoride ion, and 0.01–10g/l of surfactant could be used to deposit a copper seed layer on a titanium nitride substrate, and then carried out an electroless plating to increase the thickness of the copper layer.

There is still a need in the art a low cost process for fabricating a reliable copper interconnection structure useful for submicron wiring in the integrated circuit chip.

SUMMARY OF THE INVENTION

Accordingly, the invention relates to a low cost process for fabricating copper interconnection structure useful for submicron circuit wiring in the integrated circuit chip, the process comprising displacement depositing a thin metal layer on trench or via subjected to lithographic process, and then depositing a conductor therein by an electroplating or electroless plating process with a solution containing additives to form a metal wiring structure of interconnections or external circuit.

The invention provides also a process for fabricating a interconnection structure on an integrated circuit, the process comprising steps of depositing an insulating dielectric layer on a silicon wafer substrate; defining and forming lines or via through lithographic process and then depositing a layer of barrier material thereon; dipping said substrate in an activating solution and performing displacement deposition to deposit a thin metal layer on the surface of said barrier layer; electrochemical depositing a conductor therein with a solution containing surfactant to form interconnection circuit; and, finally, forming metal interconnection structure by a planarizing or chemical mechanical polishing process (CMP).

Accordingly, one object of the invention is to lower the producing cost of integrated circuit by activating a substrate with a solution and performing displacement deposition to deposit a metal layer thereon as a conducting layer required for subsequent electroplating process, whereby the copper seed layer as the conducting layer by physical or chemical vapor deposition can be avoided and hence the expensive cost on vacuum equipment can be saved.

Another object of the invention is to fill a substantially uniform copper layer on submicron wiring, wherein the aspect ratio of the via is greater than 1, while the width of the via or wiring can be as small as less than 0.2 micron.

BRIEF DESCRIPTION OF THE DRAWINGS

The invention, as well as its many advantages, may be further understood by the following detailed description and drawings in which:

FIG. 5 shows schematically the structures of the silicon wafer of FIG. 4 after depositing a copper seed layer through PVD or CVD process;

FIG. 6 shows schematically the structures of the silicon wafer of FIG. 5 after fully filling vias on the surface of the wafer with copper through an electroplating process;

FIG. 7 shows schematically the structures of the silicon wafer of FIG. 6 after being subjected to a final planarizing and CMP treatment;

FIG. 8 shows schematically the structures of the silicon wafer of FIG. 5 after depositing a palladium layer instead of a copper seed layer as in FIG. 5;

DETAILED DESCRIPTION OF THE PREFERRED EMBODIMENT

Electroplating is one type of electrochemical deposition methods, and is based on the respective electrochemical half-reactions occurred at the cathode and the anode under an applied voltage, wherein an oxidation reaction occurs at the anode and a reduction reaction at the cathode, i.e., metal ions in the electrolytic solution is reduced into elemental state and deposited on the surface of the electrode plate. It is this principle that current method utilizes to fabricate copper interconnection that connects elements in various portions of the integrated circuit. Its process can be illustrated as in FIGS. 1 to 7.

Figure 1:
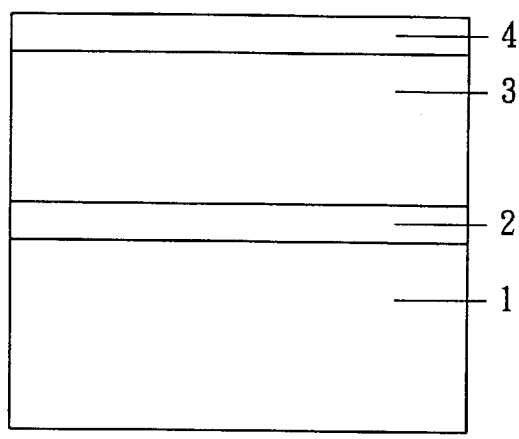
FIG. 1 shows schematically the structures of silicon wafer previously deposited an oxide layer and a dielectric layer thereon.

In FIG. 1, numerical reference 1 indicates the initial substrate, that is, the wafer itself. Numerical reference 2 and 4 is the nitride layer of the silicon substrate, i.e., silicon nitride (SiN), while 3 indicates the dielectric layer generated after a heat treatment, namely, the oxide of silicon, i.e., silicon dioxide ($SiO_2$).

Figure 2:
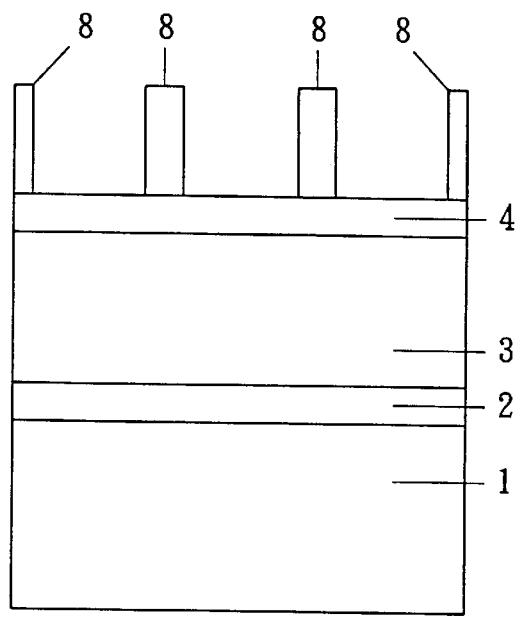
FIG. 2 shows schematically the structures of the silicon wafer of FIG. 1 after applying a photoresist layer.

The numerical reference 8 in FIG. 2 indicates a photoresist that coats the surface of the substrate and corresponds to a photomask as required by the wiring over the entire integrated circuit.

Figure 3:
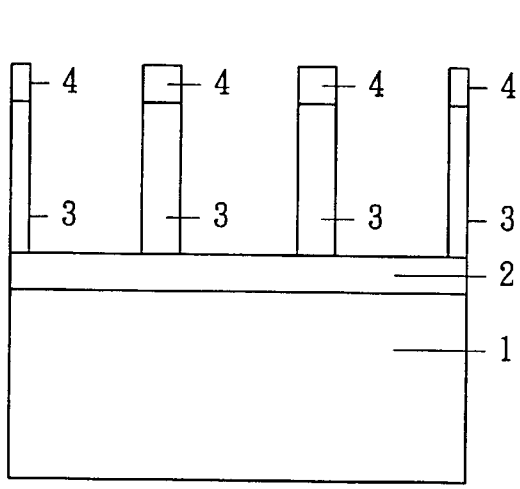
FIG. 3 shows schematically the structures of the silicon wafer of FIG. 2 after being subjected to a lithographic process.

FIG. 3 shows schematically the result after microlithographic etching process, and it is found that part of the dielectric layer and of nitride layer had been removed. Thereafter, the photoresist is removed.

Figure 4:
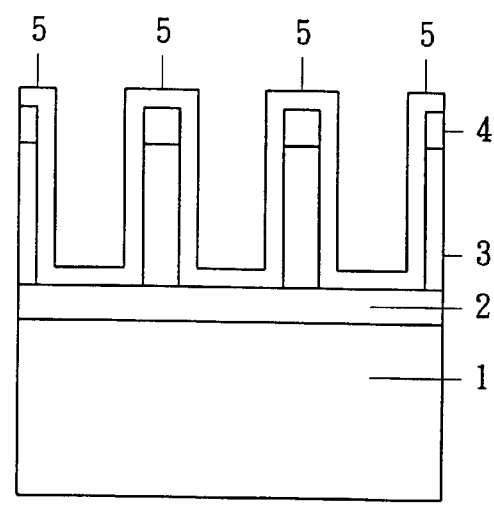
FIG. 4 shows schematically the structures of the silicon wafer of FIG. 3 after depositing a barrier material.

In FIG. 4, a layer of diffusion barrier material 5 is deposited over the dielectric layer, such as titanium nitride (TiN), tantalum nitride (TaN) or tantalum, which functions to prevent the diffusion of copper layer into the dielectric layer during the subsequent heat treatment that might affect the transmission in the interconnection.

FIG. 5 illustrates the deposition of a copper seed layer 6 through physical vapor deposition (PVD) or chemical vapor deposition (CVD), which is used as a conducting layer for electroplating thereafter.

FIG. 6 illustrates, by conducting via the copper seed layer deposited above, trenches or vias are fully filled in a manner of electroplating, where the area indicated at 7 is the copper layer plated via this manner.

FIG. 7 shows the substrate after polishing the protruding part on the surface through a final planarization and chemical mechanical polishing process. The steps as described in FIGS. 1 to 7 can be repeated to fabricate multi-layer copper interconnection structure.

Steps illustrated in FIG. 8 is the process provided according to the invention to replace the step of depositing seed layer with a vacuum equipment as illustrated in step 5. According to the invention, a wet activating formula is provided to activate the barrier material 5, that is, tantalum nitride or titanium nitride, deposited as described in FIG. 4, and also allows a contact displacement reaction to be occurred between them and the metal ions in the solution. The formula comprises 0.2–20 g/l of palladium ionic compound, 0.6–60 g/l of halogen ionic compound, 0.9–9 g/l of an inorganic acid, and 10–1000 ppm of a surfactant.

Thus, in one aspect of the invention, a process for displacement depositing a seed layer over a barrier layer on a substrate is provided, wherein said seed layer thus deposited can act as an electrically conducting layer required during filling fine vias through electroplating; said process comprising steps of:

(1) preparing displacement deposition solution, consisting of 0.2–20 g/l of palladium ionic compound, 0.6–60 g/l of halogen ionic compound, 0.09–9 g/l of inorganic acid and 10–1000 ppm of surfactant, and having a pH of about 1 to 7.0; and (2) immersing said substrate having a barrier material deposited thereon in said depositing solution prepared as in step (1) at a temperature of 20 to 70° C. for 1–20 minutes.

Palladium compound useful in the process of the invention is for example, palladium halide ($PdX_2$), palladium nitrate [$Pd(NO_3)_2$], palladium sulfate ($PdSO_4$), palladium perchlorate [$Pd(ClO_4)_2$] or palladium acetate [$Pd(OA_c)_2$].

Suitable palladium halide is, for example, palladium chloride ($PdCl_2$), palladium bromide ($PdBr_2$), or palladium iodide ($PdI_2$). Halogen ionic compound useful in the process of the invention is for example, fluoride, chloride, bromide or iodide compound, derived from hydrogen halide or ionic compound form from hydrogen halide with metal from Group IA and IIA.

Inorganic acid useful in the process of the invention is for example, nitric acid ($HNO_3$), sulfuric acid ($H_2SO_4$), hydrogen fluoride (HF), hydrogen chloride (HCl), hydrogen bromide (HBr) or hydrogen iodide (HI) and perchloric acid (HClO$_4$).

Suitable surfactant useful in the process of the invention is for example, polyethylene glycol, polypropylene glycol, or ethylene oxide (EO)/propylene oxide (PO) copolymer.

In the process of the invention, said barrier layer is tantalum nitride (TaN) or titanium nitride (TiN).

In one embodiment, a formula of depositing solution is consisted of 1.77 g/l of palladium chloride (PdCl$_2$), 5.7 g/l of ammonium hydrogen fluoride (NH$_4$F.HF) and 0.63 g/l of nitric acid (HNO$_3$).

In the second step of the process according to the invention comprises dipping the substrate having a deposited resist material thereon into the displacement reaction solution for about 5minutes. The displacement reaction solution has a pH in a range of 1 to 7, preferably 4 to 5, a temperature of 20–70° C., preferably 40° C.

Palladium chloride in the formula functions as the source of palladium ions, while ammonium hydrogen fluoride plays a critical role for driving this reaction. In effect, ammonium hydrogen fluoride itself is a buffer solution of hydrogen fluoride. Moreover, since the solubility of palladium chloride in the aqueous solution is not high, nitric acid is used to increase the solubility of palladium chloride and adjusting the pH of the solution.

Figure 9:
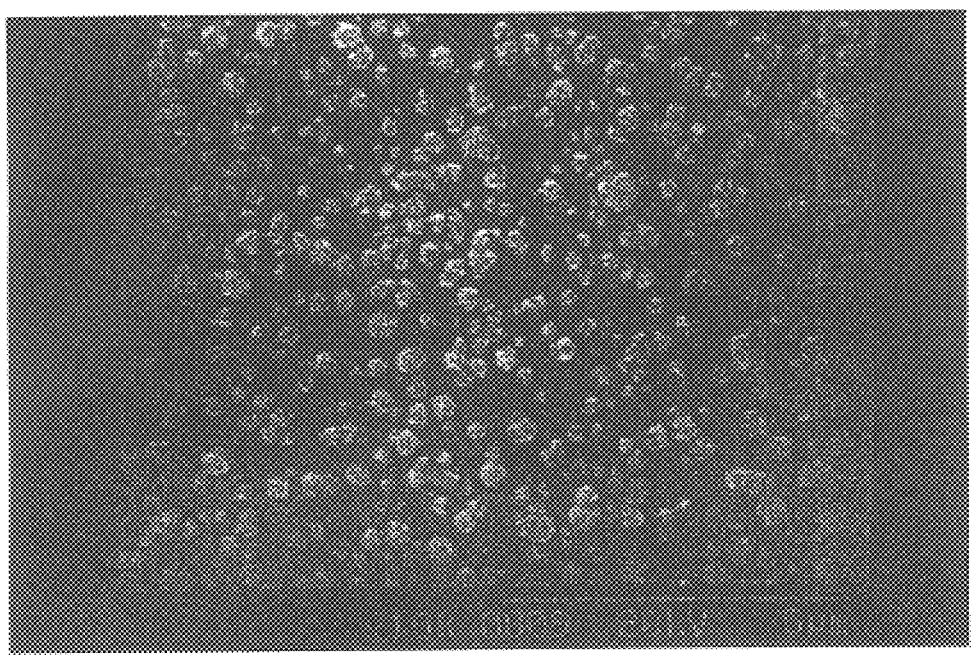
FIG. 9 illustrates the deposition of a layer of palladium on a planar tantalum nitride substrate through displacement deposition catalyzed by ammonium hydrogen fluoride.

In the present invention, the displacement deposition can be carried out not only on the silicon substrate, various silicides, or titanium nitride substrate, but also on the tantalum nitride to substrate. With respect to the barrier material acting as copper conductor, tantalum nitride has better reliability and chemical stability than titanium nitride having cylindrical structure. This facilitates the industrial applicability of the invention. FIG. 9 illustrates the deposition of a dense layer of palladium on the planar tantalum nitride substrate through displacement depositing of palladous ion.

Further, in the present invention, within the composition of the displacement solution, not only copper ion can react with titanium nitride substrate, other metals such as palladium and silver, can also be deposited, through displacement plating, on the surface of titanium nitride substrate and acted as the conducting layer required for subsequent electroplating.

Thus, in another aspect of the invention, a process for displacement depositing a seed layer over a titanium nitride barrier layer on a substrate is provided, wherein said seed layer thus deposited can act as an electrically conducting layer required during filling fine vias through electroplating; said process comprising steps of:

(1) preparing displacement deposition solution, consisting of 0.2–20 g/l of silver ionic compound, 0.6–60 g/l of halogen ionic compound, 0.09–9 g/l of inorganic acid and 10–1000 ppm of surfactant, and having a pH of about 1 to 7.0; and (2) immersing said substrate having a barrier material deposited thereon in said depositing solution prepared as in step (1) at a temperature of 20 to 70° C. for 1–20 minutes.

Suitable silver ionic compound useful in the process of the invention is silver nitrate (AgNO$_3$) or silver perchlorate (AgClO$_4$). Suitable halogen ionic compound useful herein is for example, fluoride, chloride, bromide or iodide compound, derived from hydrogen halide or ionic compound form from hydrogen halide with metal from Group IA and IIA.

Suitable inorganic acid useful herein is for example, nitric acid (HNO$_3$) or perchloric acid (HClO$_4$).

Suitable surfactant is for example, polyethylene glycol, polypropylene glycol, or ethylene oxide (EO)/propylene oxide (PO).

Figure 11:
FIG. 11 shows the silver metal deposited on the surface of titanium nitride through displacement plating.

FIG. 11 shows the deposition of silver on surface of the titanium nitride substrate in displacement depositing manner in one embodiment of the invention, wherein the composition of the formulation used is: 0.2–20 g/l of ionic silver compound, 0.6–60 g/l of halogen ionic compound, 0.9–9 g/l of inorganic acid and 10–1000 ppm of surfactant.

Figure 10:
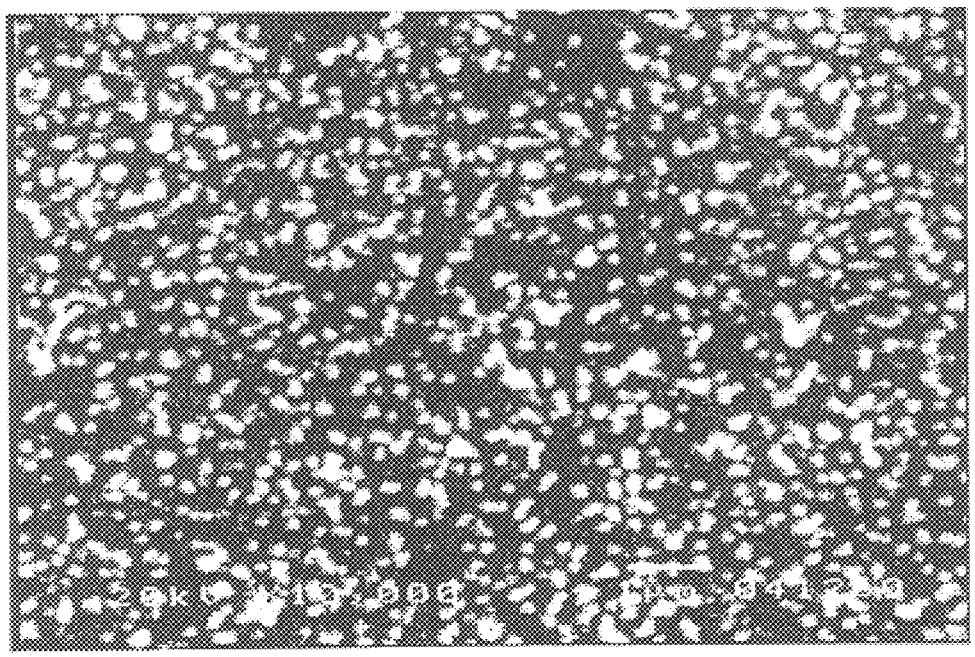
FIG. 10 illustrates the deposition of a layer of palladium on a planar titanium nitride substrate through displacement deposition catalyzed by potassium iodide.

In addition, in the present invention, the strong toxic hydrofluoric acid is not necessarily used in the composition of the displacement depositing solution. This acid can be replaced with ammonium hydrogen fluoride, i.e., the buffer solution of hydrofluoric acid. Furthermore, other halogen ions can be used to replace hydrofluoric acid to drive the contact displacement reaction between metal ions and the substrate. FIG. 10 illustrate the contact displacement reaction of palladium catalyzed by potassium iodide and the deposition thereof on the surface of the titanium nitride substrate.

The inventor believes that the reaction between the barrier material with metal ions in the solution occurs primarily due to the participation of halogen ions. The overall reaction can be generally divided into two half-reactions, wherein the oxidation reaction results in the formation of a complex between the barrier material such as tantalum nitride or titanium chloride, and halogen ion, accompanied with release of electron. The complex may be in a form of titanium hexahalide (TiX$_6^{2-}$) or tantalum hexahalide (TaX$_6^-$) complex ions. In addition, electrons released can be received by metal ions in the solution such that the metal ion is reduced into metal atom and deposited on the substrate. These metal ions include copper ion, silver ion and palladium ion, all of them being elements having a high reduction potential, which means that these metal ions are susceptible to oxidation and reduction reaction and hence readily reduced into atomic state. This is why tantalum nitride and titanium nitride both having relatively high chemical stability can be deposited with metal ion thereon through displacement plating.

Figure 12:
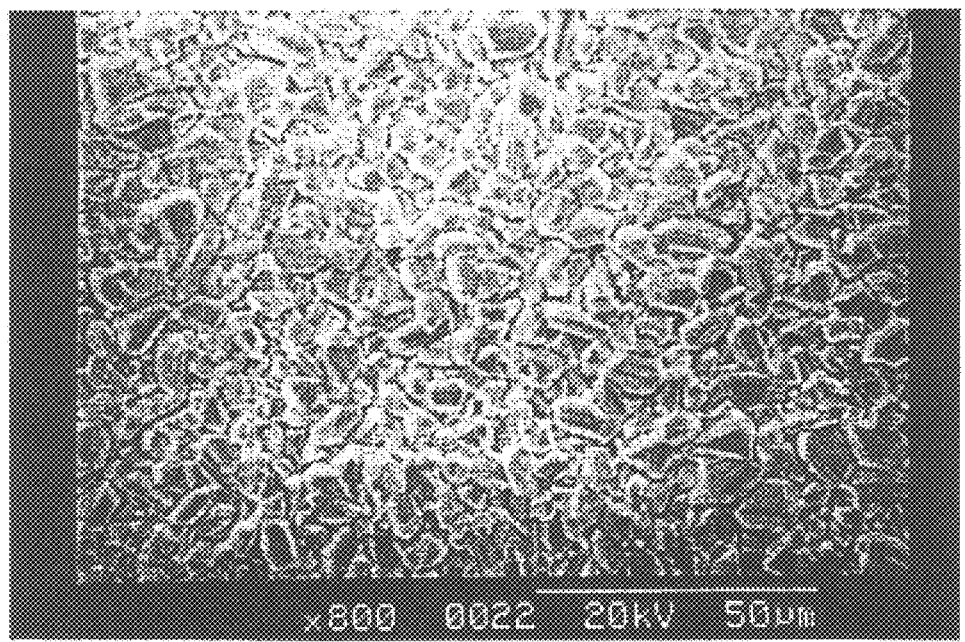
FIG. 12 illustrates the deposition, after the displacement deposition process, of a copper layer on the surface of palladium/tantalum nitride/silicon substrate directly through an electroplating process.

After carrying out displacement deposition over the barrier material, a copper layer can be deposited and its thickness be increased through electrochemical approach such as electroplating or electroless plating. In one embodiment of the invention, electroplating process commonly used in the industry was used to fill vias. The fundamental formulation of the electroplating solution is: 75 g/l of anhydrous copper sulfate (CuSO$_4$), 92 g/l of sulfuric acid and 200 ppm of chloride ion. FIG. 12 illustrates the deposition of a copper layer over the surface of palladium/tantalum nitride/silicon substrate through electroplating process after the displacement plating.

However, since the diameter of vias to be filled is extremely small, less than about 1.0 micron, the wettability of the depositing solution is also very important. Therefore, a surfactant must be added in the displacement depositing solution or electroplating solution.

Figure 13:
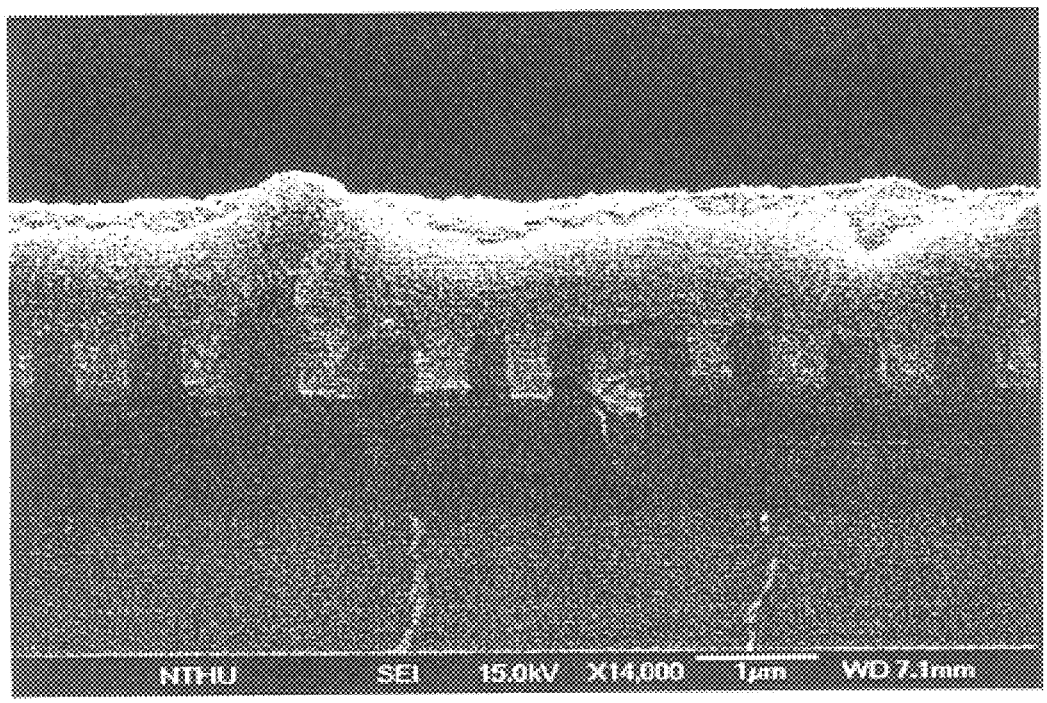
FIG. 13 shows the result of filling fine via through an electroplating process with a displacement depositing solution containing surfactant PEG5000.

As to the additive, H. G. Greutz et al. disclosed in U.S. Pat. No. 4,110,176 that, by using polyalkanol quaternary ammonium salt formed from the reaction product, a bright, low stress and ductile copper layer could be deposited from the acidic copper depositing solution. Dahms et al. in U.S. Pat. No. 4,975,159 compiled and tabulated many types of additives, including lactam formed from alkyloxylation, sulfur-containing compound having aqueous solubilizing groups, and organic compounds. The present invention adopts polyethylene glycol as the additive in the displacement deposition and electroplating solutions, which is different from the prior art techniques. FIG. 13 shows the result of filling fine via through an electroplating process with a displacement depositing solution containing surfactant PEG5000.

As the electroplating system, the present invention adopts the apparatus of R. J. Contolinii as reference, which comprises a main deposition bath, a circulating filtering system, and a automatic controlling system. The main deposition bath is designed as in cylindrical shape, wherein the bath is divided into inner, middle and outer regions. The inner region is the region where electroplating is carried out. The deposition bath is a cylinder in a dimension of 10 cm diameter and 7.5 cm height, has a bottom but not lid, and a wall thickness of about 5 mm. The bottom of the deposition bath has a fixed glass tube which has an opening of 1 cm diameter and a height of 5 mm, and which is perpendicular to the bath bottom. That glass tube is communicated with external pipes, pumps and flowmeter and is functions as the inlet of external depositing solution into the inner bath region. In this configuration, a design of injection flow is set up such that the depositing solution can flush the cathode directly to enhance the mass transfer effect of the metal ion. The middle bath region functions mainly as an overflow region and a filtering channel. The bottom of the middle region is the part extended from the bottom of the inner region. The wall height of the middle region is 11 cm. The outer region of the main deposition bath is in a closed design with a capacity of 1.8 liter, which envelops the middle and inner bath regions. Two openings, low and high, are provided on the bath wall, both in a diameter of 8 mm, and are the inlet and outlet of water from a thermostat, respectively. By circulating water flow of constant temperature, the depositing solution can be kept at a constant temperature such that the electroplating process can be operated at a constant temperature.

In the design of the electroplating bath, in addition to provide the electroplating devices as the cathode and the anode, other sensors can be incorporated, such as reference electrode, thermometer, pH meter and the like, as well as controlling the temperature by means of a thermostat. Moreover, the injection flow type of agitation design that can control flow rate makes most of the operation be carried out in the electroplating bath without using additionally any sub-bath. The volume of the depositing solution in the bath is about 1 liter. The cylindrical design of the main bath forms an approximately symmetric configuration with the arrangement of the cathode and the anode taking upper and lower positions, respectively. The object of this design is to make the distribution of the electric field and fluid field within the deposition bath being more symmetric and the operation of the experiment simpler.

Prior to be drawn into the deposition bath, the depositing solution has to be subjected to active carbon treatment to remove organic impurities and then filtered through filters of $10\mu$, $5\mu$, and $1\mu$, respectively. The circulating filtering system in the electroplating process is consisted primarily of a pump and two filters that can filter off $1\mu$ and $0.2\mu$, respectively, at a filtering rate of 1.5 L/min., to remove small particulates in the depositing solution. The automatic controlling system is consisted of a potentiostat and a computer processor containing a Autolab software. For example, a potentiostat Model 362 available from EG&G Company can provide deposition bath a constant current and the Autolab software can monitor the current and read data at any time.

EXAMPLE

| Depositing solution formulation 1 | |
|---|---|
| Palladium chloride | 10 g/l |
| Sodium chloride | 30 g/l |
| Nitric acid | 4.5 g/l |
| Polyethylene glycol | 400 ppm |
| Depositing solution formulation 2 | |
| Silver nitrate | 12 g/l |
| Sodium chloride | 35 g/l |
| Nitric acid | 5.0 g/l |
| Polyethylene glycol | 500 ppm |
| Depositing solution formulation 3 | |
| Silver nitrate | 15 g/l |
| Sodium chloride | 40 g/l |
| Nitric acid | 6.0 g/l |
| EO/PO copolymer | 600 ppm |

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A process for displacement depositing a seed layer over a barrier layer on a substrate, wherein said seed layer thus deposited can act as an electrically conducting layer required during filling fine vias through electroplating; said process comprising steps of:

(1) preparing displacement deposition solution, consisting of 0.2–20 g/l of palladium ionic compound, 0.6–60 g/l of halogen ionic compound, 0.09–9 g/l of inorganic acid and 10–1000 ppm of surfactant, wherein said surfactant is polyethylene glycol, polypropylene glycol, or ethylene oxide (EO)/propylene oxide (PO) copolymer and having a pH of about 1 to 7.0; and (2) immersing said substrate having said barrier layer thereon in said depositing solution prepared as in step (1) at a temperature of 20 to 70° C. for 1–20 minutes.

2. A process as in claim 1, wherein said palladium compound is palladuim halide ($PdX_2$) palladuim nitrate [$Pd(NO_3)_2$], palladuim sulfate ($PdSO_4$), palladium perchlorate [$Pd(ClO_4)_2$] or palladuim acetate [$Pd(OAc)_2$].

3. A process as in claim 2, wherein said palladium halide is palladium chloride ($PdCl_2$), palladium bromide ($PdBr_2$), or palladium iodide ($PdI_2$).

4. A process as in claim 1, wherein said halogen ionic compound is a fluoride, chloride, bromide or iodide compound, derived from hydrogen halide or an ionic compound formed from hydrogen halide with a metal from Group IA or IIA.

5. A process as in claim 1, wherein said inorganic acid is nitric acid ($HNO_3$), sulfuric acid ($H_2SO_4$), hydrogen fluoride (HF), hydrogen chloride (HCl), hydrogen bromide (HBr) or hydrogen iodide (HI) and perchloric acid ($HClO_4$).

6. A process as in claim 1, wherein said barrier layer is tantalum nitride (TaN) or titanium nitride (TiN).

7. A process for displacement depositing a seed layer over a titanium nitride barrier layer on a substrate, wherein said seed layer thus deposited can act as an electrically conducting layer required during filling fine vias through electroplating; said process comprising steps of:

(1) preparing displacement deposition solution, consisting of 0.2–20 g/l of silver ionic compound, 0.6–60 g/l of halogen ionic compound, 0.09–9 g/l of inorganic acid and 10–1000 ppm of surfactant, wherein said surfactant is polyethylene glycol, polypropylene glycol, or ethylene oxide (EO)/propylene oxide (PO) copolymer and having a pH of about 1 to 7.0; and (2) immersing said substrate having said barrier layer thereon in said depositing solution prepared as in step (1) at a temperature of 20 to 70° C. for 1–20 minutes.

8. A process as in claim 7, wherein said silver ionic compound is silver nitrate ($AgNO_3$) or silver perchlorate ($AgClO_4$).

9. A process as in claim 7, wherein said halogen ionic compound is a fluoride, chloride, bromide or iodide compound, derived from hydrogen halide or an ionic compound formed from hydrogen halide with a metal from Group IA or IIA.

10. A process as in claim 7, wherein said inorganic acid is nitric acid ($HNO_3$) or perchloric acid ($HClO_4$).

* * * * *